(12) United States Patent
Rieger et al.

(10) Patent No.: US 8,587,033 B1
(45) Date of Patent: Nov. 19, 2013

(54) MONOLITHICALLY INTEGRATED HEMT AND CURRENT PROTECTION DEVICE

(75) Inventors: Walter Rieger, Villach (AT); Oliver Häberlen, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/487,795

(22) Filed: Jun. 4, 2012

(51) Int. Cl.
*H01L 29/66* (2006.01)

(52) U.S. Cl.
USPC ........................................................ 257/195

(58) Field of Classification Search
USPC .................. 257/191, 192, 194, 195, E29.246, 257/E21.403, E21.407
See application file for complete search history.

(56) References Cited

U.S. PATENT DOCUMENTS

| | | | |
|---|---|---|---|
| 5,396,085 A | 3/1995 | Baliga | |
| 5,614,749 A | 3/1997 | Ueno | |
| 5,818,084 A * | 10/1998 | Williams et al. | 257/329 |
| 6,979,861 B2 | 12/2005 | Rodov et al. | |
| 2005/0145883 A1 | 7/2005 | Beach et al. | |
| 2006/0017056 A1 | 1/2006 | Hirler | |
| 2011/0210338 A1* | 9/2011 | Briere | 257/76 |
| 2012/0056648 A1* | 3/2012 | Iwabuchi et al. | 327/109 |

FOREIGN PATENT DOCUMENTS

| | | |
|---|---|---|
| DE | 10250175 B4 | 2/2005 |
| DE | 102004029435 A1 | 1/2006 |

OTHER PUBLICATIONS

Qin Huang et al "MOS Controlled Diodes—A New Power Diode." Solid-State Electronics. vol. 38, No. 5. pp. 977-980. Elsevier Science Ltd., 1995. Great Britain.
Derrick Chen et al. "Super Barrier Rectifier—A New Generation of Power Diode." Digital Power Europe, 2007.

* cited by examiner

*Primary Examiner* — Kyoung Lee
*Assistant Examiner* — Christina Sylvia
(74) *Attorney, Agent, or Firm* — Murphy, Bilak & Homiller, PLLC

(57) ABSTRACT

A transistor device includes a high electron mobility field effect transistor (HEMT) and a protection device. The HEMT has a source, a drain and a gate. The HEMT switches on and conducts current from the source to the drain when a voltage applied to the gate exceeds a threshold voltage of the HEMT. The protection device is monolithically integrated with the HEMT so that the protection device shares the source and the drain with the HEMT and further includes a gate electrically connected to the source. The protection device conducts current from the drain to the source when the HEMT is switched off and a reverse voltage between the source and the drain exceeds a threshold voltage of the protection device. The protection device has a lower threshold voltage than the difference of the threshold voltage of the HEMT and a gate voltage used to turn off the HEMT.

25 Claims, 9 Drawing Sheets

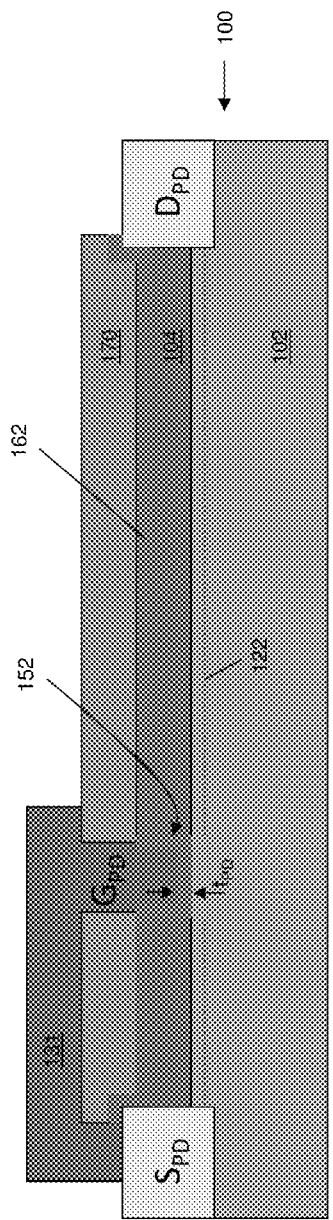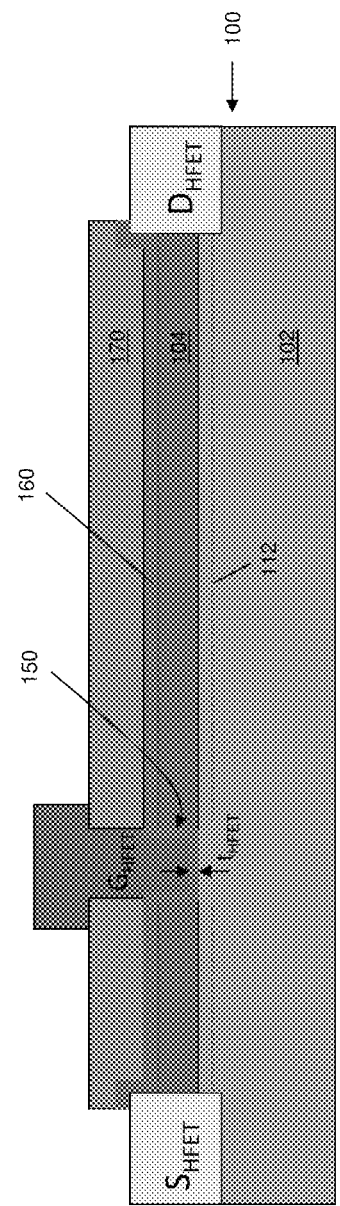
Figure 2A
Figure 2B

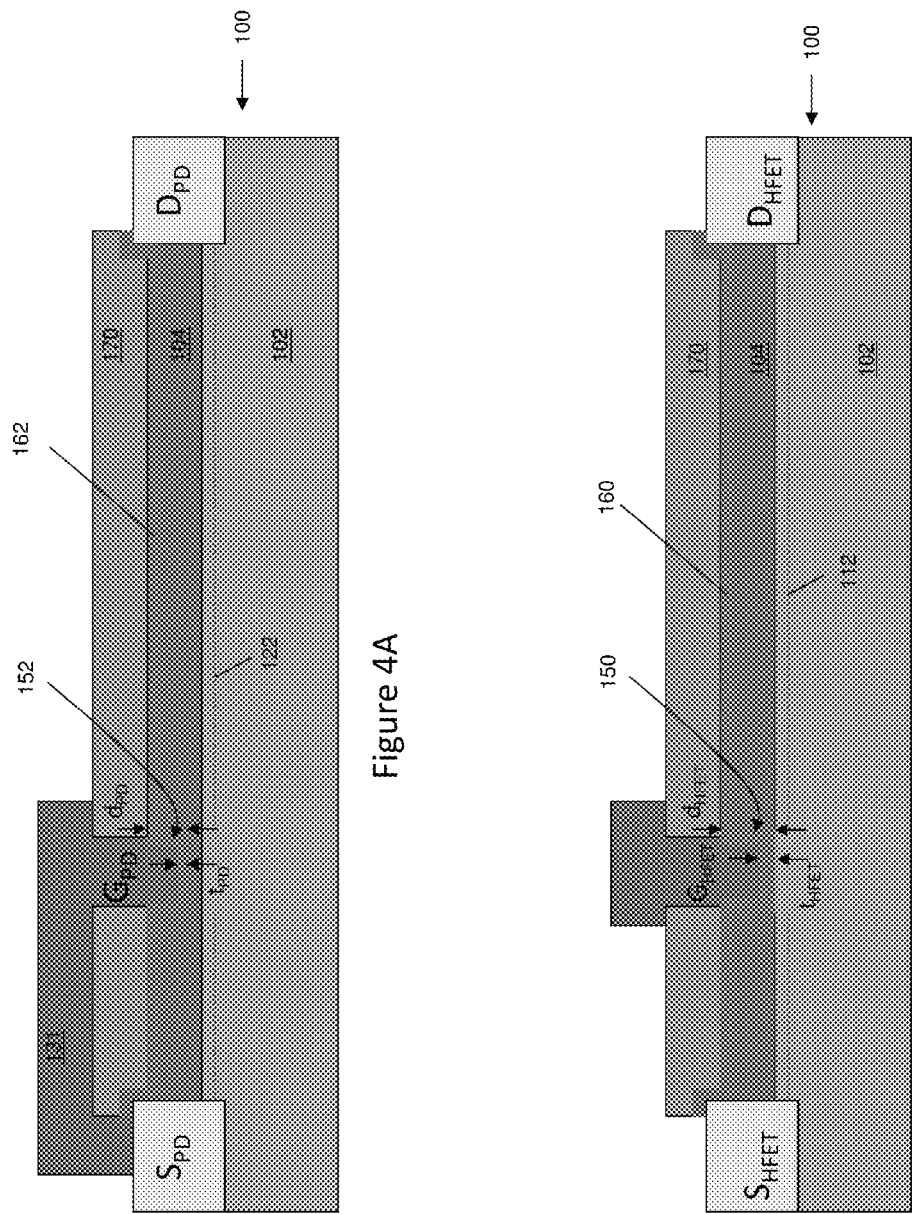

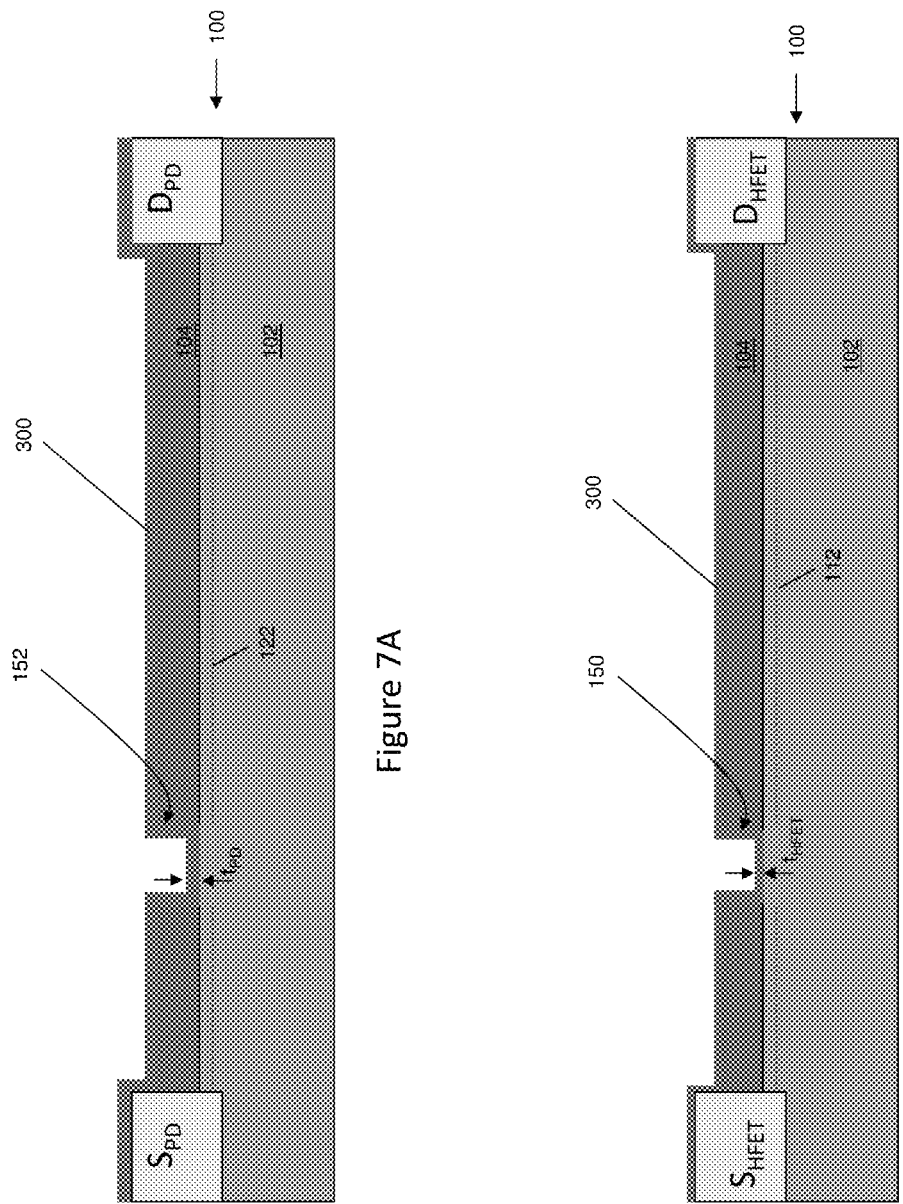

MONOLITHICALLY INTEGRATED HEMT AND CURRENT PROTECTION DEVICE

TECHNICAL FIELD

The instant application relates to high electron mobility field effect transistors (HEMTs), and more particularly to optimized reverse diodes monolithically integrated with HEMTs.

BACKGROUND

Power MOSFETs (metal oxide semiconductor field effect transistors) are widely used in DC-DC converters. The MOSFETs are optimized to minimize losses occurring in each switching cycle. In each cycle, multiple switching phases to be passed by the MOSFET, which are different in each switching phase result in losses that can be enlarged or reduced by specific transistor parameters. During each one of these phases the entire current flows backward through the MOSFET for a short time which has a normally closed channel, with the body diode of the MOSFET forward biased. The power loss is calculated at this time by the product of current times the forward voltage of the body diode. Under these operating conditions typical body diodes have forward voltages of about 0.9V, resulting in MOSFETs with diode losses that noticeably reduce the overall efficiency of the DC-DC converter.

GaN-based HEMTs (high electron mobility transistors) are being used more widely in DC-DC converters in the future. A HEMT, also known as heterostructure FET (HFET) or modulation-doped FET (MODFET), is a field effect transistor incorporating a junction between two materials with different band gaps (i.e., a heterojunction) as the channel instead of a doped region, as is generally the case for MOSFET. HEMTs have no body diode in the conventional sense. Nevertheless, the channel opens under the gate electrode of an HEMT in the off state in the reverse direction when the potential at the drain with respect to source a small negative voltage is applied. The flux of such a voltage MOS-gated reverse diode (MGD) correlates with the difference in the threshold voltage of the HEMT. However, the threshold voltage of the HEMT cannot be made too small because otherwise the HEMT would switch on again dynamically, resulting in massive losses. This requires the forward voltage of the quasi reverse diode not be set as low as it otherwise would be beneficial for optimum efficiency.

One way the body diode forward voltage for Si-based MOSFETs (also in general) can be reduced is to connect a Schottky diode in parallel with the body diode of the transistor. This additional diode has, depending on the metal contact, a lower forward voltage of about 0.4V. As such, the power loss during phase shifts of a DC-DC converter is only half as large compared to just the body diode. Even with a low threshold voltage, contacts needed for the Schottky diode cause high reverse leakage currents at higher temperatures which can be disruptive for the application. Schottky diodes can also be used with lateral HEMTs based on III-nitride. Such conventional structures however result in a forward voltage which is limited by the material to about 1V.

A trench structure or columnar pn structures provided to the right and left of the Schottky contact can reduce the fields near the Schottky contact, resulting in reduced leakage currents. Both the trench and columnar pn concepts, however, prove difficult to implement for a Schottky contact integrated with the process of a trench MOSFET. These concepts also degrade the quality of the Schottky contact in the last process steps that are necessary for the MOSFET. The robustness of the Schottky contact with current and temperature stress in the application is also not optimal.

It would be desirable to have a structure in which the flux-voltage is further lowered and the threshold voltage is separately optimized.

SUMMARY

The embodiments described herein provide an HEMT with an additional monolithically integrated transistor region, also referred to herein as a protection device or parallel connected Schottky like diode. The HEMT can be normally-on or normally-off, and the protection device has a threshold voltage slightly higher than 0V (e.g. greater than 0 V and less than 1.5 V). By shorting the gate electrode of the protection device to the source, a transistor region is obtained that has a minimal forward voltage slightly higher than 0V. Dynamic restoring of the transistor region of the protection device is suppressed by the internal gate-source short-circuit. The HEMT has a threshold voltage different than that of the protection device, and can be made sufficiently high for the target application while the threshold voltage of the protection device remains relatively low to ensure low switching power loss and reliable operation of the HEMT e.g. when implemented as part of a DC-DC converter.

According to an embodiment of a transistor device, the transistor device comprises an HEMT having a source, a drain and a gate. The HEMT is operable to switch on and conduct current from the source to the drain when a voltage applied to the gate exceeds a threshold voltage of the HEMT. The transistor device further comprises a protection device monolithically integrated with the HEMT so that the protection device shares the source and the drain with the HEMT and further comprises a gate electrically connected to the source. The protection device is operable to conduct current from the drain to the source when the HEMT is switched off and a reverse voltage between the source and the drain exceeds a threshold voltage of the protection device. The threshold voltage of the protection device is less than the difference of the threshold voltage of the HEMT and a gate voltage used to turn off the HEMT.

According to an embodiment of a DC-to-DC converter, the DC-DC converter comprises a high-side transistor for coupling to a load, a low-side HEMT for coupling to the load and a protection device monolithically integrated with the low-side HEMT so that the protection device shares a source and a drain with the low-side HEMT and further comprises a gate electrically connected to the source. The protection device is operable to conduct current between the drain and the source when the low-side HEMT is switched off, the high-side HEMT is switched off and a reverse voltage between the source and the drain exceeds a threshold voltage of the protection device. The threshold voltage of the protection device is less than the difference of the threshold voltage of the HEMT and the gate voltage used to turn off the HEMT.

According to an embodiment of a semiconductor device, the semiconductor device comprises a compound semiconductor body and an HEMT comprising a source extending into the compound semiconductor body, a drain spaced apart from the source and extending into the compound semiconductor body, a gate disposed in a first trench extending into the compound semiconductor body, and a first insulator separating the gate from the compound semiconductor body in the first trench. The semiconductor device further comprises a protection device comprising a source common with the source of the HEMT, a drain common with the drain of the HEMT, a gate disposed in a second trench extending into the compound semiconductor body and electrically connected to the source, and a second insulator separating the gate of the protection device from the compound semiconductor body in the second trench. At least one of the first insulator is thinner in the first trench than the second insulator in the second trench and the first trench extends deeper into the compound semiconductor body than the second trench.

According to an embodiment of a method of manufacturing a semiconductor device, the method comprises: forming a high electron mobility field effect transistor (HEMT) in a compound semiconductor body, the HEMT comprising a source extending into the compound semiconductor body, a drain spaced apart from the source and extending into the compound semiconductor body, a gate disposed in a first trench extending into the compound semiconductor body, and a first insulator separating the gate from the compound semiconductor body in the first trench; and monolithically integrating a protection device with the HEMT so that the protection device has a source common with the source of the HEMT, a drain common with the drain of the HEMT, a gate disposed in a second trench extending into the compound semiconductor body and electrically connected to the source, a second insulator separating the gate of the protection device from the compound semiconductor body in the second trench, and at least one of the first insulator is thinner in the first trench than the second insulator in the second trench and the first trench extends deeper into the compound semiconductor body than the second trench.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIGS. 2A and 2B illustrate cross-sectional views of the protection device and the HEMT, respectively, according to an embodiment.

FIGS. 4A and 4B illustrate cross-sectional views of the protection device and the HEMT, respectively, according to yet another embodiment.

FIGS. 7A and 7B illustrate cross-sectional views of another method of manufacturing a semiconductor device with an HEMT and a protection device monolithically integrated in parallel with the HEMT.

DETAILED DESCRIPTION

Figure 1:
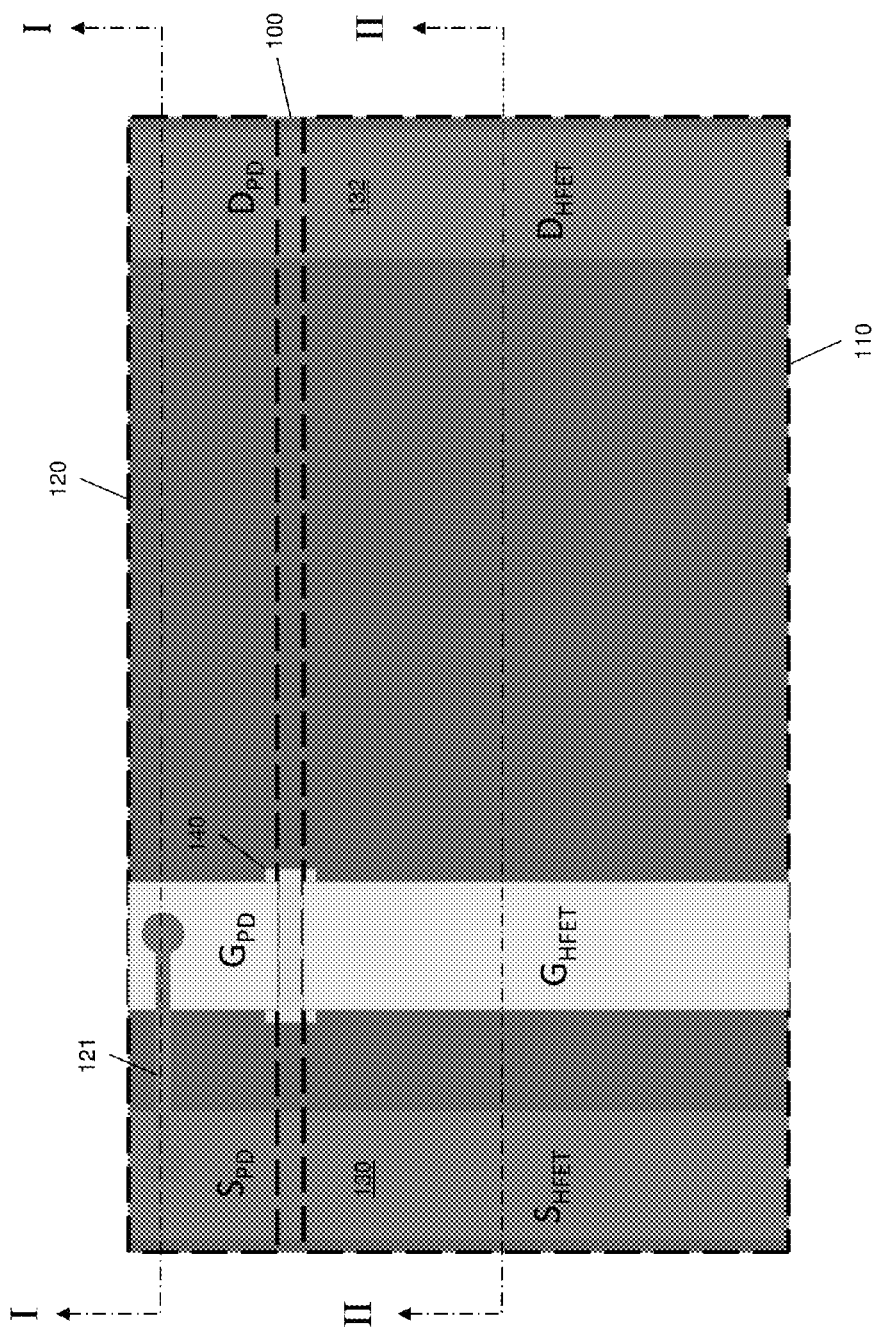
FIG. 1 illustrates a top-down plan view of a semiconductor device with an HEMT and a protection device monolithically integrated in parallel with the HEMT.

FIG. 1 illustrates a top-down plan view of an embodiment of a semiconductor device including a compound semiconductor body 100, a high electron mobility field effect transistor (HEMT) 110 disposed in the semiconductor body 100 and a protection device 120 monolithically integrated with the HEMT 110 so that the protection device 120 has a source ($S_{PD}$) common with the source ($S_{HEMT}$) of the HEMT 110 and a drain ($D_{PD}$) common with the drain ($D_{HEMT}$) of the HEMT 110. According to one embodiment, the HEMT 110 and the protection device 120 share the same source 130 and drain 132 as shown in FIG. 1. In another embodiment, the source and drain of the HEMT 110 may be spaced apart from the source and drain of the protection device 120, respectively, but electrically connected e.g. via a metal wire. In each case, the HEMT 110 and the protection device 120 have a common (shared) source and a common (shared) drain. However, the gate ($G_{HEMT}$) of the HEMT 110 is separate from and not connected to the gate ($G_{PD}$) of the protection device 120.

The HEMT 110 can be normally-on meaning that the HEMT 110 operates in depletion mode, or normally-off meaning that the HEMT 110 operates in enhancement mode. For example, a normally-off HEMT 110 has a channel region (out of view in FIG. 1) that is disrupted under the HEMT gate and the HEMT 110 turns on only when a voltage applied to the gate of the HEMT 110 exceeds the threshold voltage of the HEMT 110. A typical AlGaN—GaN heterojunction leads automatically to a normally-off transistor. In FIG. 1, a normally-off vertical transistor is shown. However, a normally-off transistor can also be realized by orientating the growth substrate the a-plane. Such a growth orientation results in the threshold voltage of the transistor being influenced by the AlGaN or dielectric layer thickness.

In either case of normally-on or normally-off, the channel region of the HEMT 110 can be separated from the channel region (also out of view in FIG. 1) of the protection device 120 in the area of the compound semiconductor body 100 between gates. In one embodiment, an implanted region 140 e.g. formed of implanted Ar is formed in the compound semiconductor body 100 which disrupts the channel region in this area. The gate of the protection device 120 is electrically connected to the source 130, and schematically shown as electrical connection 121 in FIG. 1.

The HEMT 110 switches on and conducts current from the source 130 to the drain 132 (i.e. positive current) when a voltage applied to the gate of the HEMT 110 exceeds the threshold voltage of the HEMT 110. Otherwise, the HEMT 110 is switched off or in a high impedance state. The protection device 120 conducts current from the drain 132 to the source 130 (i.e. negative current, commonly referred to as commutating) when the HEMT 110 is switched off and the reverse voltage between the source 130 and the drain 132 exceeds the threshold voltage of the protection device 120. The threshold voltage of the protection device 120 is less than the difference of the threshold voltage of the HEMT 110 and the gate voltage used to turn off the HEMT 110. For example, a normally-on HEMT 110 may have a threshold voltage of −3 V and turn off at −5 V. The threshold voltage or effective "body diode" voltage of the protection device 110 is therefore −3 V minus −5 V or 2V in this purely illustrative example. The protection device 120 turns on and sinks current from the drain 132 to source 130 when the HEMT 110 is switched off and negative current is present in the circuit (i.e. the circuit is commutating). In one embodiment, the threshold voltage of the protection device 120 is greater than 0 V and less than 1.5 V and the threshold voltage of the HEMT 110 is greater than 1.5 V. In general, the threshold voltage of the HEMT 110 can be made as high as needed for the target application. The threshold voltage of the protection device 120 can be set lower than that of the HEMT 110 by adjusting one or more geometries and/or materials of the HEMT 110 and protection device 120 as described in more detail in the following embodiments.

FIG. 2A shows a cross-sectional view of the protection device 120 along the line labeled I in Figure, and FIG. 2B shows a cross-sectional view of the HEMT 110 along the line labeled II in FIG. 1. According to the embodiment illustrated in FIGS. 2A and 2B, the compound semiconductor body 100 includes a GaN buffer layer 102 on a nucleation layer (not shown) and a GaN alloy barrier layer 104 on the GaN buffer layer 102. The barrier layer 104 may comprise any suitable GaN alloy such as AlGaN, InAlN, AlN or InAlGaN. The source 130 extends through the GaN alloy barrier layer 104 into the GaN buffer layer 102. The drain 132 is spaced apart from the source 130 and also extends through the GaN alloy barrier layer 104 into the GaN buffer layer 102. The HEMT 110 and the protection device 120 share the same source 130 and drain 132.

In general with GaN technology, GaN-based heterostructures can be grown along the c-plane (i.e., the polar Ga-face), the a-plane (i.e., the non-polar Ga-face) or along the N-face (nitrogen face) e.g. for GaN/AlGaN heterostructures. Each growth orientation can be used in fabricating the GaN-based structures described herein. Also with GaN technology, the presence of polarization charges and strain effects result in the realization of a two-dimensional charge carrier gas which is a two-dimensional electron or hole inversion layer characterized by very high carrier density and carrier mobility. Such a two-dimensional charge carrier gas forms the conductive channel region 112 of the HEMT 110 and the conductive channel region 122 of the protection device 120. A thin e.g. 1-2 nm AlN layer can be provided between the GaN buffer layer 102 and the GaN alloy barrier layer 104 to minimize alloy scattering and enhance 2DEG mobility. Other compound semiconductor technologies which have a two-dimensional electron or hole gas can also be used. In each case, polarization charges are used to form the two-dimensional charge carrier gas channel regions 112, 122 of the HEMT 110 and the protection device 120. Other combinations of III-V semiconductor materials can be used in order to form a 2DEG or 2DHG (two-dimensional hole gas) in the buffer layer 102 as is well known in the art. In general, any heterostructure can be used where a band discontinuity is responsible for the device concept. For example with an AlGaAs system there is no piezoelectric effect, but a confinement concept which involves arranging quantum wells for confinement of the channel is possible.

According to the embodiment shown in FIGS. 2A and 2B, the gate ($G_{HEMT}$) of the HEMT 110 and the gate ($G_{PD}$) of the protection device 120 can both comprise p-type GaN. Such p-type GaN gates result in the HEMT 110 and the protection device 120 being normally-off. For p-type GaN, no barrier or dielectric is necessary for normally-off operation. The thickness and/or doping concentration of the p-type GaN gate of the HEMT 110 can be different than that of the p-type GaN gate of the protection device 120 so that the HEMT 110 and the protection device 120 have different threshold voltages. Metal or poly-Si can be used as the gate material for the HEMT 110 and the protection device 120 instead of p-type GaN. Alternatively, the AlGaN or dielectric layer thickness is different for the HEMT 110 than for the protection device 120 so that the threshold voltages are different for HEMT 110 and integrated protection devices 120 grown along the a-plane of a substrate. In yet other embodiments, the HEMT 110 and the protection device 120 can be normally-on instead of normally-off, meaning that a negative threshold voltage must be applied to the gate in order to pinch off the underlying channel region 112, 122.

Regardless, the HEMT gate is disposed in a first trench 150 extending into GaN alloy barrier layer 104. A first insulator 160 separates the HEMT gate from the GaN alloy barrier layer 104 in the first trench 150. The protection device gate is disposed in a second trench 152 extending into the GaN alloy barrier layer 104. The gate of the protection device 120 is electrically connected to the common source 130 through a metal layer 131 which e.g. can be an extension of the gate metal. A second insulator 162 separates the gate of the protection device 120 from the GaN alloy barrier layer 104 in the second trench 152. In one embodiment, the first and second insulators 160, 162 are formed from the same insulating layer e.g. aluminum oxide or silicon nitride. An additional insulating layer 170 such as SiN, Zr or Hf oxide can also be provided on the gate insulators 160, 162.

In each case, the first insulator 160 is thinner ($t_{HEMT}$) in the first trench 150 and the second insulator 162 is thicker ($t_{PD}$) in the second trench 152. The thickness of the gate insulator material partly determines threshold voltage for HEMTs implemented as normally-off devices by using p-type GaN as the gate material. Any suitable recess and gate electrode formation process can be used for normally-off devices. A thinner gate dielectric means the p-type GaN gate is closer to the channel region 112, more strongly disrupting the channel region 112 under the HEMT gate and yielding a higher threshold voltage for normally-off devices having p-type GaN gates. As such, the normally-off HEMT 110 has a thinner gate insulator 160 than the protection device 120 so that the protection device 120 has a lower threshold voltage than the difference of the threshold voltage of the HEMT 110 and the gate voltage used to turn off the HEMT 110.

Figure 3A:
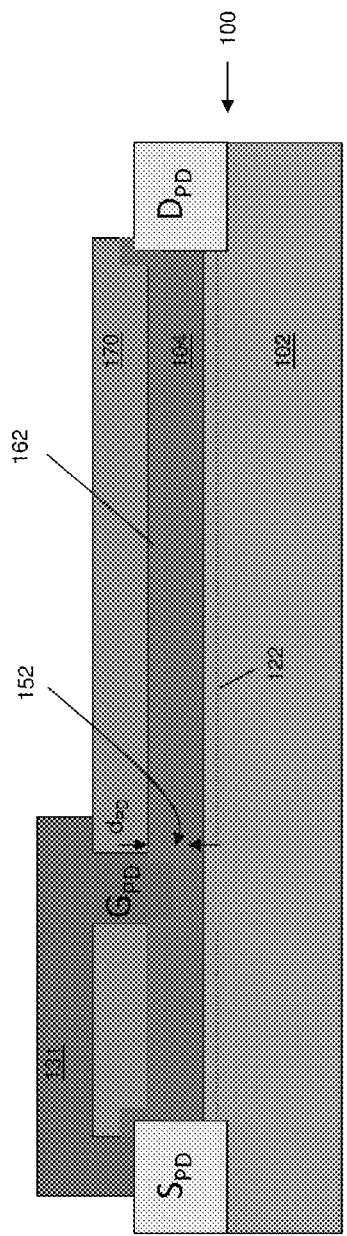
FIGS. 3A and 3B illustrate cross-sectional views of the protection device and the HEMT, respectively, according to another embodiment.
Figure 3B:
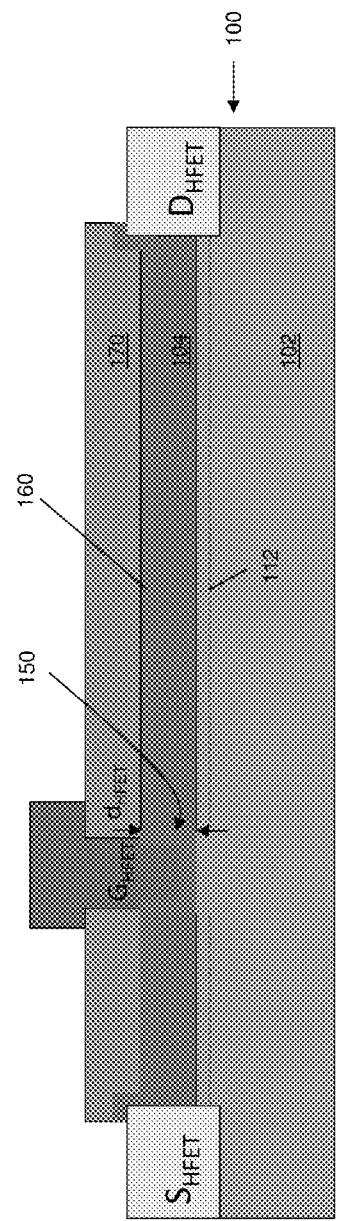

FIG. 3A shows another cross-sectional view of the protection device 120 along the line labeled I in Figure, and FIG. 3B shows another cross-sectional view of the HEMT 110 along the line labeled II in FIG. 1. The embodiment illustrated in FIGS. 3A and 3B is similar to the one illustrated in FIGS. 2A and 2B, however the gate insulator material 160, 162 has relatively the same (uniform) thickness in both the protection device region and the HEMT region of the compound semiconductor body 100. The threshold voltage of the protection device 120 is set lower than the difference of the threshold voltage of the HEMT 110 and the gate voltage used to turn off the HEMT 110 by varying the gate trench depth and not the gate insulator thickness according to the embodiment shown in FIGS. 3A and 3B. The gate trench depth partly determines threshold voltage for HEMTs implemented as normally-off devices. A deeper trench means the gate is closer to the channel region, more strongly disrupting the channel region under the gate and yielding a higher threshold voltage for normally-off devices. As such, the gate trench 150 of the HEMT 110 extends deeper ($d_{HEMT}$) into the compound semiconductor body 100 than the gate trench 152 ($d_{PD}$) of the protection device 120 so that the protection device 120 has a lower threshold voltage than the difference of the threshold voltage of the HEMT 110 and the gate voltage used to turn off the HEMT 110.

FIG. 4A shows yet another cross-sectional view of the protection device 120 along the line labeled I in Figure, and FIG. 4B shows yet another cross-sectional view of the HEMT 110 along the line labeled II in FIG. 1. The embodiment illustrated in FIGS. 4A and 4B is a combination of the embodiment illustrated in FIGS. 2A and 2B and the embodiment illustrated in FIGS. 3A and 3B. That is, the gate insulator 160 of the HEMT 110 is thinner ($t_{HEMT}$) than the gate insulator 162 ($t_{PD}$) of the protection device 120 and the gate trench 150 of the HEMT 110 extends deeper ($d_{HEMT}$) into the compound semiconductor body 100 than the gate trench 152 ($d_{PD}$) of the protection device 120 so that the protection device 120 has a lower threshold voltage than the difference of the threshold voltage of the HEMT 110 and the gate voltage used to turn off the HEMT 110.

Figure 5B:
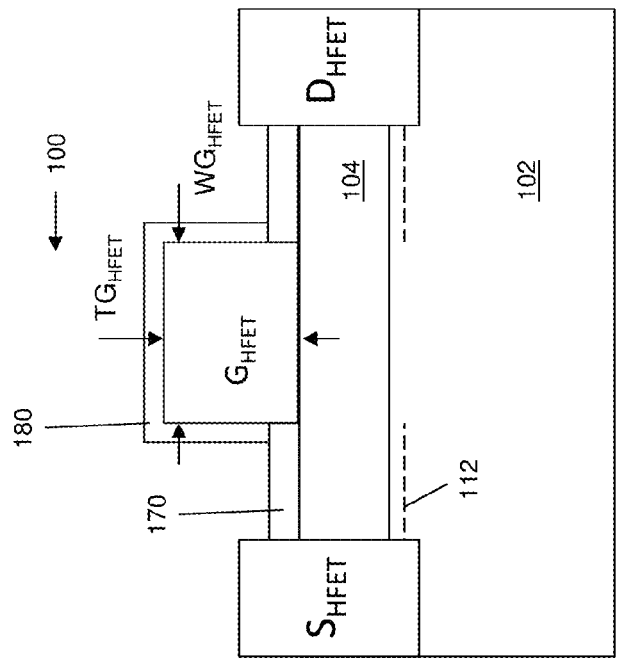
FIGS. 5A and 5B illustrate cross-sectional views of the protection device and the HEMT, respectively, according to still another embodiment.
Figure 5A:
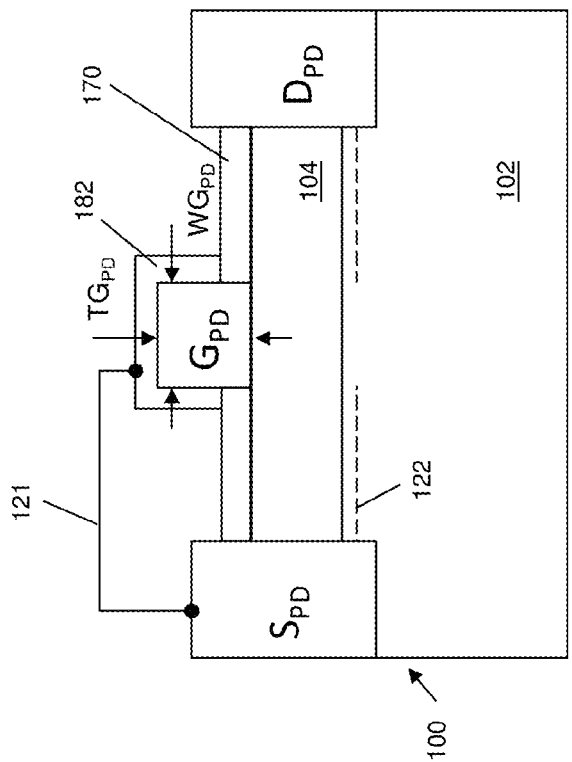

FIG. 5A shows still another cross-sectional view of the protection device 120 along the line labeled I in Figure, and FIG. 5B shows still another cross-sectional view of the HEMT 110 along the line labeled II in FIG. 1. According to the embodiment illustrated in FIGS. 5A and 5B, the gate ($G_{HEMT}$) of the HEMT 110 and the gate ($G_{PD}$) of the protection device 110 are undoped i.e. intrinsic or slightly n or p-doped (unintentionally) as a result of the epitaxy processing involved in growing the buffer and barrier layers 102, 104. That is, the epitaxy processing results in active dopant atoms being present in the gate regions which are not purposely doped in a deliberate step or steps. Whether the gate regions are undoped or doped, both gates are thick enough to deplete the 2DEG in the channel region 112, 122 under the respective gates so that the HEMT 110 and the protection device 120 each have a positive threshold voltage and thus are considered to be normally-off.

Providing a relatively thick undoped or slightly n or p-doped gate ($G_{HEMT}$) for the HEMT 110 ensures the HEMT 110 is normally-off without requiring p-type doping of this region. In one embodiment, the HEMT gate is an undoped GaN layer (which can be slightly n or p-type doped as a result of the epitaxial processing) having a thickness ($TG_{HEMT}$) of about 150 nm to 200 nm or greater. This relatively thick GaN gate generates a vertical field which depletes the 2DEG in the channel region 112 below the HEMT gate, realizing a normally-off device. The GaN gate pulls up the conduction band and therefore depletes the underlying channel region 112. As such, the thickness of the GaN gate can be tuned so that the HEMT 110 has a controllable positive threshold voltage. The gate ($G_{PD}$) of the protection device 120 can be made of the same material (e.g. GaN), and have a smaller thickness ($TG_{PD}$) than the HEMT gate so that the protection device 120 has a lower threshold voltage than the difference of the threshold voltage of the HEMT 110 and the gate voltage used to turn off the HEMT 110.

In one embodiment, the width ($WG_{HEMT}$) of the GaN HEMT gate is between about 100 nm to 500 nm. If the width of the GaN HEMT gate is reduced to the range of a few hundred nanometers, the channel region 112 below the HEMT gate can be controlled via the vertical electric field and also via lateral fringe capacitances. Accordingly a two-dimensional effect is utilized which adds a degree of freedom in tuning the electrical properties of the HEMT 110, with respect to conventional p-type GaN gate approaches. The GaN gate of the protection device 120 can have a smaller width ($WG_{PD}$) than the HEMT gate so that the protection device 120 has a lower threshold voltage than the difference of the threshold voltage of the HEMT 110 and the gate voltage used to turn off the HEMT 110. In one embodiment, the HEMT gate is thicker and wider than the gate of the protection device 120.

A first gate metal 180 is provided in contact with the undoped GaN gate of the HEMT 110. A second gate metal 182 is provided in contact with the undoped GaN gate of the protection device 120. The second gate metal 182 can extend to the source ($S_{PD}$) of the protection device 120, electrically connecting the GaN gate of the protection device 120 to the source. Alternatively, a different metal connection can be provided for connecting the GaN gate of the protection device 120 to the source. The electrical connection between the GaN gate of the protection device 120 and the source is schematically shown as connection 121 in FIG. 5A. In each case, the first gate metal 180 and the second gate metal 182 can comprise different materials, have different thicknesses, or both so that HEMT 110 and the protection device 120 have different threshold voltages.

Figure 6A:
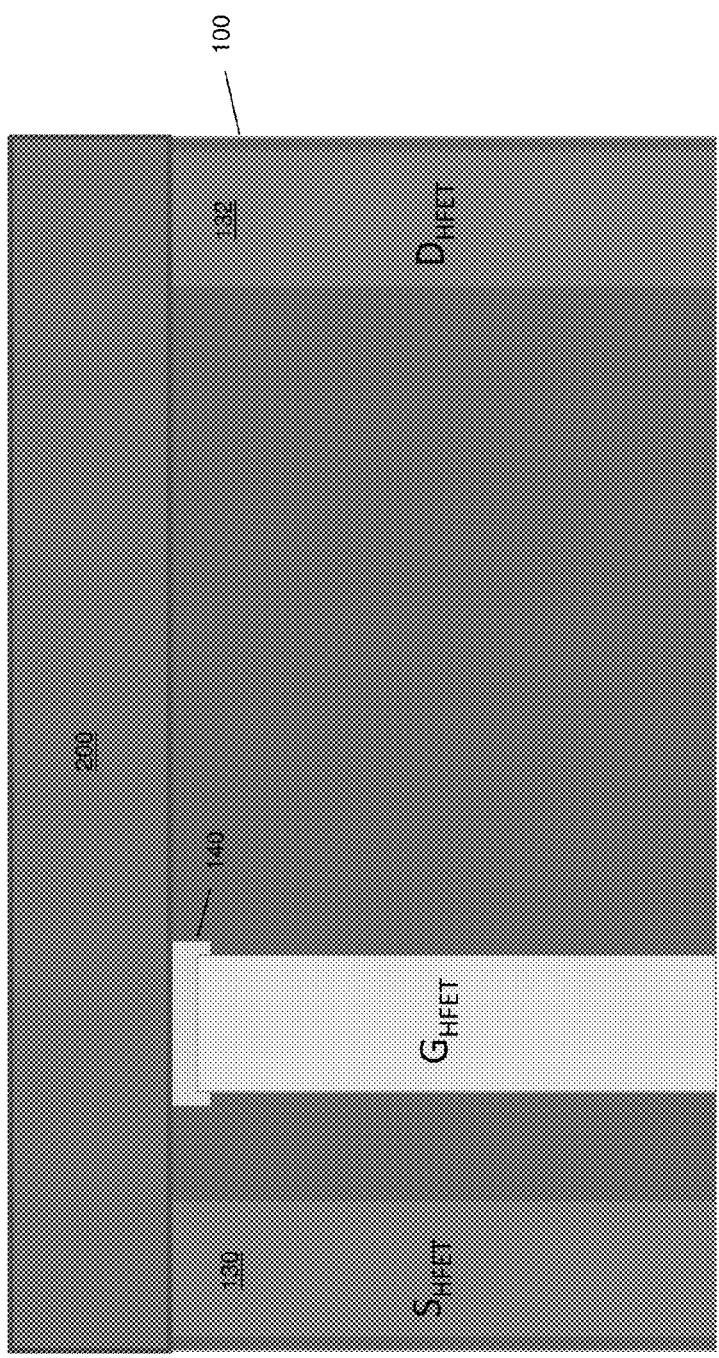
FIGS. 6A and 6B illustrate top-down plan views of a method of manufacturing a semiconductor device with an HEMT and a protection device monolithically integrated in parallel with the HEMT.
Figure 6B:
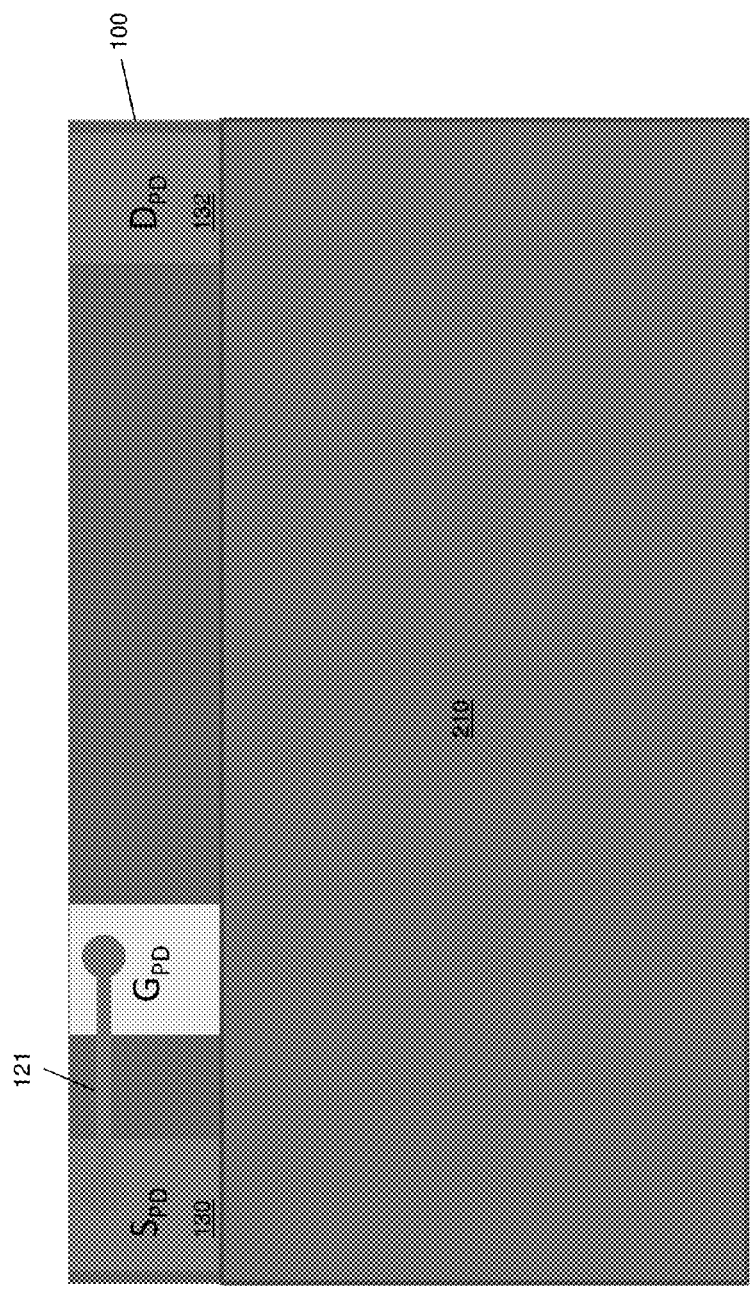

FIGS. 6A and 6B illustrate an embodiment of a method of manufacturing a semiconductor device having the HEMT 110 formed in the compound semiconductor body 100 and the protection device 120 monolithically integrated with the HEMT 110 so that the protection device 120 has a lower threshold voltage than the difference of the threshold voltage of the HEMT 110 and the gate voltage used to turn off the HEMT 110. In FIG. 6A, the HEMT 110 is formed while the region of the compound semiconductor body 100 allocated for the protection device 120 is protected e.g. by a mask layer 200. FIG. 6B shows the compound semiconductor body 100 when the protection device 120 is subsequently formed while the region of the compound semiconductor body 100 allocated for the HEMT 110 is protected e.g. by a different mask layer 210.

In one embodiment, the HEMT gate insulator 160 is formed thinner in the HEMT gate trench 150 than the protection device gate insulator 162 in the protection device gate trench 152 as shown in FIGS. 2A and 2B so that the protection device 120 has a lower threshold voltage than the difference of the threshold voltage of the HEMT 110 and the gate voltage used to turn off the HEMT 110. In another embodiment, the HEMT gate trench 150 is etched deeper into the compound semiconductor body 100 than the protection device gate trench 152 as shown in FIGS. 3A and 3B so that the protection device 120 has a lower threshold voltage than the difference of the threshold voltage of the HEMT 110 and the gate voltage used to turn off the HEMT 110. For example, the HEMT gate trench 150 can be completely formed when the protection device region is protected and the protection device gate trench 152 can be completely formed when the HEMT region is protected. Alternatively, both gate trenches 150, 152 can be etched to the same depth in the compound semiconductor body 100 i.e. the final depth of the protection device gate trench 152 when both regions are unmasked. The protection device region is then protected e.g. via a mask 200, and the etching process continued in the HEMT region so that the HEMT gate trench 150 is etched deeper into the compound semiconductor body 100. In yet another embodiment, the HEMT gate insulator 160 is formed thinner in the HEMT gate trench 150 than the protection device gate insulator 162 in the protection device gate trench 152 and the HEMT gate trench 150 is etched deeper into the compound semiconductor body 100 than the protection device gate trench 152 as shown in FIGS. 4A and 4B so that the protection device 120 has a lower threshold voltage than the difference of the threshold voltage of the HEMT 110 and the gate voltage used to turn off the HEMT 110.

FIGS. 7A and 7B illustrate another embodiment of a method of manufacturing a semiconductor device having the HEMT 110 formed in the compound semiconductor body 100 and the protection device 120 monolithically integrated with the HEMT 110 so that the protection device 120 has a lower threshold voltage than the difference of the threshold voltage of the HEMT 110 and the gate voltage used to turn off the HEMT 110. FIG. 7A shows a cross-sectional view of the protection device 120 along the line labeled I in Figure, and FIG. 4B shows a cross-sectional view of the HEMT 110 along the line labeled II in FIG. 1. The HEMT 110 and the protection device 120 are formed at the same time according to this embodiment. In both cases, the respective gates have yet to be formed in FIGS. 7A and 7B. The threshold voltage of the protection device 120 is set lower than the difference of the threshold voltage of the HEMT 110 and the gate voltage used to turn off the HEMT 110 by selectively depositing a contiguous dielectric material 300 such as aluminum oxide on the compound semiconductor body 100 that is thinner in the HEMT region and thicker in the protection device region so that the insulator in the HEMT gate trench 150 is thicker than the insulator in the protection device gate trench 152.

Figure 8:
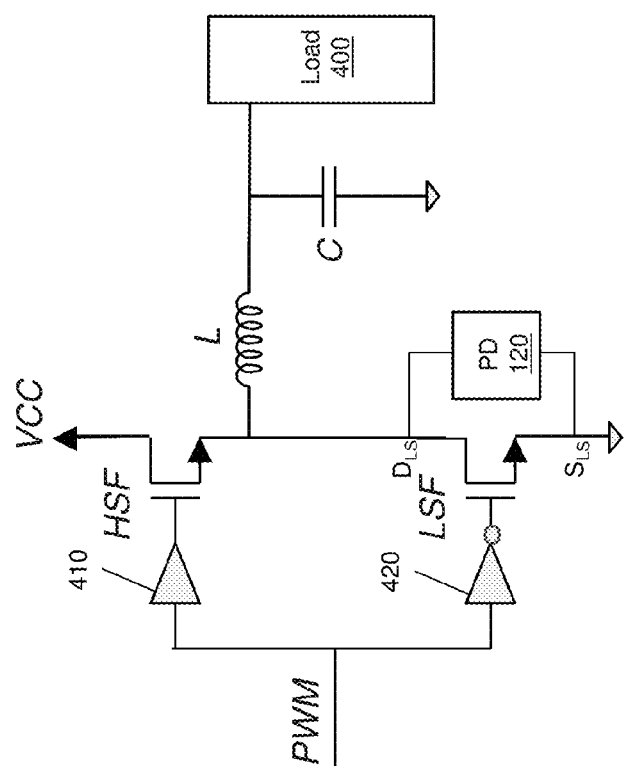
FIG. 8 illustrates a circuit diagram of a DC-DC converter including a high-side HEMT, a low-side HEMT and a protection device monolithically integrated in parallel with the low-side HEMT.

FIG. 8 illustrates a circuit diagram of a DC-to-DC converter comprising a high-side transistor (HSF) such as an HEMT for switchably coupling a load 400 to VCC through an inductor (L) and a low-side HEMT (LSF) for switchably coupling the load 400 to ground through the inductor. The high-side and low-side transistors can be integrated on the same die or fabricated on different die. In either case, the high-side HEMT is driven by a first driver 410 and the low-side HEMT is driven by a second driver 420. In one embodiment, the DC-DC converter is a switching regulator and the input to the drivers can be a PWM (pulse width modulation) signal which controls the duty cycle of the HEMTs as a function of the voltage applied to the load or the current flowing through the inductor. In each case, a protection device 120 is monolithically integrated with the low-side HEMT so that the protection device 120 shares a source ($S_{LS}$) and a drain ($D_{SS}$) with the low-side HEMT and further comprises a gate electrically connected to the source as previously described herein. The protection device 120 conducts negative current between the drain and the source of the low-side HEMT when the low-side HEMT is switched off, the high-side HEMT is switched off and a reverse voltage between the source and the drain of the protection device 120 exceeds the threshold voltage of the protection device 120. The threshold voltage of the protection device 120 is less than the difference of the threshold voltage of the low-side HEMT and a gate voltage used to turn off the low-side HEMT as previously described herein. In one embodiment, the threshold voltage of the protection device 120 is greater than 0 V and less than 1.5 V.

The low-side HEMT can have robustness against unintentional restarting of the HEMT due to parasitic inductances in the circuit, and therefore the low-side HEMT can have a threshold voltage in the range between 2V and 4V. Such a threshold voltage corresponds to a reverse conductivity of the low-side HEMT at VDS (drain-to-source voltage) of −2V to −4V. The reverse-flow voltage of the DC-DC converter is lowered significantly by connecting the protection device 120 in parallel with the low-side HEMT as previously described herein, the protection device 120 having an extremely low but still positive threshold voltage (e.g. less than 0.6V). The locally reduced threshold voltage in the region of the protection device 120 is not visible in the transfer characteristic of the low-side HEMT, since the gate of the protection device 120 is connected to the source potential. By providing the protection device 120 having a threshold voltage shifted slightly higher than 0V (e.g. 0.6V) and the gate shorted to the source, a transistor region is provided which has a minimal forward voltage e.g. above −0.6V. A dynamic restoring of the low-side HEMT region is suppressed by the internal gate-to-source short circuit of the protection device 120. The threshold voltage of the low-side HEMT can be set sufficiently high for the intended application. The protection device 120 monolithically integrated in parallel with the low-side HEMT can be 1% to 50% of the overall transistor size.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A transistor device, comprising:
a high electron mobility field effect transistor (HEMT) having a source, a drain, a gate, and a first insulator separating the gate from a compound semiconductor body of the transistor device, the HEMT operable to switch on and conduct current from the source to the drain when a voltage applied to the gate exceeds a threshold voltage of the HEMT; and
a protection device monolithically integrated with the HEMT so that the protection device shares the source and the drain with the HEMT and further comprises a gate electrically connected to the source and a second insulator separating the gate of the protection device from the compound semiconductor body, the protection device operable to conduct current from the drain to the source when the HEMT is switched off and a reverse voltage between the source and the drain exceeds a threshold voltage of the protection device, the threshold voltage of the protection device being less than the difference of the threshold voltage of the HEMT and a gate voltage used to turn off the HEMT,
wherein the first insulator is thinner under the gate of the HEMT than the second insulator under the gate of the protection device.

2. The transistor device of claim 1, wherein the threshold voltage of the protection device is greater than 0 V and less than 1.5V.

3. The transistor device of claim 1, wherein the HEMT is a normally-off HEMT.

4. A DC-to-DC converter, comprising:
a high-side transistor for coupling to a load;
a low-side high electron mobility field effect transistor (HEMT) for coupling to the load; and
a protection device monolithically integrated with the low-side HEMT in a compound semiconductor body so that the protection device shares a source and a drain with the low-side HEMT and further comprises a gate electrically connected to the source, the protection device operable to conduct current between the drain and the source when the low-side HEMT is switched off, the high-side HEMT is switched off and a reverse voltage between the source and the drain exceeds a threshold voltage of the protection device, the threshold voltage of the protection device being less than the difference of the threshold voltage of the HEMT and a gate voltage used to turn off the HEMT, wherein a first insulator separating a gate of the HEMT from the compound semiconductor body is thinner than a second insulator separating the gate of the protection device from the compound semiconductor body.

5. The DC-to-DC converter of claim 4, wherein the threshold voltage of the protection device is greater than 0 V and less than 1.5V.

6. A semiconductor device, comprising:
a compound semiconductor body;
a high electron mobility field effect transistor (HEMT) comprising a source extending into the compound semiconductor body, a drain spaced apart from the source and extending into the compound semiconductor body, a gate disposed in a first trench extending into the compound semiconductor body, and a first insulator separating the gate from the compound semiconductor body in the first trench;
a protection device comprising a source common with the source of the HEMT, a drain common with the drain of the HEMT, a gate disposed in a second trench extending into the compound semiconductor body and electrically connected to the source, and a second insulator separating the gate of the protection device from the compound semiconductor body in the second trench; and
wherein at least one of the first insulator is thinner in the first trench than the second insulator in the second trench and the first trench extends deeper into the compound semiconductor body than the second trench.

7. The semiconductor device of claim 6, wherein the first insulator and the second insulator are formed from the same aluminum oxide layer.

8. The semiconductor device of claim 6, wherein the gate of the HEMT and the gate of the protection device each comprise p-type GaN, and wherein at least one of a thickness and a doping concentration of the p-type GaN gate of the HEMT is different than that of the p-type GaN gate of the protection device.

9. The semiconductor device of claim 6, wherein the gate of the HEMT and the gate of the protection device each comprise undoped GaN, and wherein at least one of a thickness and a width of the undoped GaN gate of the HEMT is different than that of the undoped GaN gate of the protection device.

10. The semiconductor device of claim 9, further comprising a first gate metal in contact with the undoped GaN gate of the HEMT and a second gate metal in contact with the undoped GaN gate of the protection device, and wherein the first gate metal and the second gate metal comprise different materials, have different thicknesses, or both.

11. The semiconductor device of claim 6, wherein a two-dimensional electron gas arises in the compound semiconductor body between the source and the drain, wherein the two-dimensional electron gas is interrupted below the gate of the HEMT when a voltage applied to the gate of the HEMT is below a threshold voltage of the HEMT, and wherein the two-dimensional electron gas is interrupted below the gate of the protection device when a voltage applied to the gate of the protection device is below a threshold voltage of the protection device.

12. The semiconductor device of claim 11, further comprising an implanted region which disrupts the two-dimensional electron gas in the compound semiconductor body between the HEMT and the protection device.

13. The semiconductor device of claim 6, wherein the HEMT is a normally-off HEMT.

14. The semiconductor device of claim 6, wherein the compound semiconductor body comprises an AlGaN layer disposed on a GaN layer, a two-dimensional electron gas arises near the interface between the AlGaN layer and the GaN layer, and a thickness of the AlGaN layer is different for the HEMT than for the protection device.

15. A method of manufacturing a semiconductor device, comprising:
forming a high electron mobility field effect transistor (HEMT) in a compound semiconductor body, the HEMT comprising a source extending into the compound semiconductor body, a drain spaced apart from the source and extending into the compound semiconductor body, a gate disposed in a first trench extending into the compound semiconductor body, and a first insulator separating the gate from the compound semiconductor body in the first trench; and
monolithically integrating a protection device with the HEMT so that the protection device has a source common with the source of the HEMT, a drain common with the drain of the HEMT, a gate disposed in a second trench extending into the compound semiconductor body and electrically connected to the source, a second insulator separating the gate of the protection device from the compound semiconductor body in the second trench, and at least one of the first insulator is thinner in the first trench than the second insulator in the second trench and the first trench extends deeper into the compound semiconductor body than the second trench.

16. The method of claim 15, wherein the HEMT is formed while a region of the compound semiconductor body allocated for the protection device is protected and the protection device is formed at a different time while a different region of the compound semiconductor body allocated for the HEMT is protected so that the first insulator is formed thinner in the first trench than the second insulator in the second trench.

17. The method of claim 16, wherein the first insulator and the second insulator are formed from the same aluminum oxide layer deposited over both regions of the compound semiconductor body.

18. The method of claim 15, wherein the HEMT is formed while a region of the compound semiconductor body allocated for the protection device is protected and the protection device is formed at a different time while a different region of the compound semiconductor body allocated for the HEMT is protected so that the first trench is etched deeper into the compound semiconductor body than the second trench.

19. The method of claim 15, wherein the HEMT is formed while a region of the compound semiconductor body allocated for the protection device is protected and the protection device is formed at a different time while a different region of the compound semiconductor body allocated for the HEMT is protected so that the first insulator is formed thinner in the first trench than the second insulator in the second trench and the first trench is etched deeper into the compound semiconductor body than the second trench.

20. The method of claim 19, wherein the first insulator and the second insulator are formed from the same aluminum oxide layer deposited over both regions of the compound semiconductor body.

21. The method of claim 15, wherein the first insulator in the first trench and the second insulator in the second trench are formed by selectively depositing a contiguous dielectric material on the compound semiconductor body that is thinner in the first trench and thicker in the second trench.

22. The method of claim 15, wherein the first and second trenches are formed by etching the second trench and part of the first trench into the compound semiconductor body at the same time and protecting the second trench while the first trench is etched deeper into the compound semiconductor body.

23. The method of claim 15, wherein the gate of the HEMT and the gate of the protection device both comprise p-type GaN, and wherein at least one of a thickness and a doping concentration of the p-type GaN gate of the HEMT is different than that of the p-type GaN gate of the protection device.

24. The method of claim 15, wherein the gate of the HEMT and the gate of the protection device both comprise undoped GaN, and wherein at least one of a thickness and a width of the undoped GaN gate of the HEMT is different than that of the undoped GaN gate of the protection device.

25. The method of claim 24, further comprising forming a first gate metal of a first material in contact with the undoped GaN gate of the HEMT and a second gate metal of a second material different than the first material in contact with the undoped GaN gate of the protection device, and wherein the first gate metal and the second gate metal comprise different materials, have different thicknesses, or both.

\* \* \* \* \*